United States Patent
Deschamps et al.

(10) Patent No.: US 6,525,305 B2
(45) Date of Patent: Feb. 25, 2003

(54) LARGE CURRENT WATCHDOG CIRCUIT FOR A PHOTODETECTOR

(75) Inventors: Pierre D. Deschamps, Coteau-du-Lac (CA); Claude J. Trottier, Laval (CA)

(73) Assignee: PerkinElmer Canada, Inc., Vaudreuil (CA)

( * ) Notice: Subject to any disclaimer, the term of this patent is extended or adjusted under 35 U.S.C. 154(b) by 0 days.

(21) Appl. No.: 09/949,064

(22) Filed: Sep. 7, 2001

(65) Prior Publication Data

US 2002/0145107 A1 Oct. 10, 2002

Related U.S. Application Data

(60) Provisional application No. 60/231,793, filed on Sep. 11, 2000.

(51) Int. Cl.⁷ ............................................. H01J 40/14
(52) U.S. Cl. ................................ 250/214 R; 250/214 C
(58) Field of Search ........................ 250/214 R, 214 C; 327/514

(56) References Cited

U.S. PATENT DOCUMENTS

| | | | |
|---|---|---|---|
| 4,369,371 A | * 1/1983 | Hara et al. | 250/551 |
| 4,558,213 A | * 12/1985 | Aizawa et al. | 250/214 R |
| 4,710,622 A | * 12/1987 | Imamura | 250/214 R |
| 4,794,261 A | * 12/1988 | Rosen | 250/551 |
| 4,872,080 A | 10/1989 | Hentschel et al. | |
| 4,945,277 A | 7/1990 | Iwatani et al. | |
| 5,296,697 A | 3/1994 | Moses, Jr. | |
| 5,371,354 A | * 12/1994 | Domon et al. | 250/214 R |
| 5,532,474 A | 7/1996 | Dautet et al. | |
| 5,789,738 A | * 8/1998 | Reime | 250/214 R |
| 5,933,042 A | 8/1999 | Trottier et al. | |
| 6,091,748 A | 7/2000 | Yasuda | |
| 6,307,196 B1 | * 10/2001 | Thompson et al. | 250/214 A |

* cited by examiner

*Primary Examiner*—Stephone Allen
*Assistant Examiner*—Eric J Spears
(74) *Attorney, Agent, or Firm*—Iandiorio & Teska (57) ABSTRACT

A large current watchdog circuit for a photodetector, the circuit including a current sensing device responsive to current flowing through the photodetector and a variable impedance transistor responsive to the current sensing device and the photodetector which increases in resistance in response to current flowing though the photodetector to protect the photodetector and any front end sensing electronics from high current levels.

24 Claims, 5 Drawing Sheets

LARGE CURRENT WATCHDOG CIRCUIT FOR A PHOTODETECTOR

PRIORITY CLAIM

This application claims priority from Provisional Patent Application Ser. No. 60/231,793 filed Sep. 11, 2000.

FIELD OF THE INVENTION

This invention relates to a current limiting circuit and more particularly a circuit which limits the amount of charge flowing in a photodetector such as an avalanche photodiode to prevent damage thereof and also to prevent damage to any front end sensing electronics.

BACKGROUND OF THE INVENTION

A photodetector is a device that converts light intensity into an electrical signal. The three most common types of photodetectors are photodiodes, avalanche photodiodes, and photomultiplier tubes. The first two types of photodetectors are semiconductor devices that detect low levels of electromagnetic radiation (photons) and are constructed so that a photon dislodges an electron (primary electron) and creates a hole-electron pair. These holes and electrons move in the opposite direction in the semiconductor device due to the electrical field that is applied across the photodiode. This movement of electrons through the structure is called photocurrent and it is proportional to the light intensity. In avalanche photodiodes, the primary electron hits other atoms with sufficient velocity and energy in the lattice structure to create additional electron-hole pairs. This cascade effect in avalanche photodiodes results in an effective gain and allows the detection of very low light levels. Indeed, single photon detection is possible using an avalanche photodiode combined with an active quench circuit. This type of operation of an avalanche photodiode is called the Geiger mode when the avalanche photodiode is biased above its breakdown voltage. Three examples of active quench circuits are shown in U.S. Pat. Nos. 5,532,474; 5,933,042; and 4,945,277 all of which are incorporated herein by this reference.

A photomultiplier tube type photodetector includes a cascade of dynodes in a vacuum tube that converts photons into electrons and the multiplication effect of the primary photon electron creates the necessary electrical gain.

Under normal operating conditions, photodetectors are biased below the breakdown voltage and the photocurrent is relatively small. In most of these applications, front end sensing electronics including, inter alia, an amplifier circuit is required to convert the photocurrent of the photodetector to a voltage level above the background noise of the following stage electronics. The resulting voltage signal is indicative of the light intensity striking the photodetector.

In all photodetector applications, damage would occur if the photocurrent induced by errant light exceeds the front end sensing electronics limited breakdown level. Errant light can strike the photodetector, for example, when a laser is in close proximity to the photodetector and laser light scatters and is directed at the photodetector. Decreasing the susceptibility of the front end sensing electronics to high photocurrent values is not an easy task and most of the time it leads to performance degradation including noise and degraded speed. In any case, improving the front end sensing electronics does not protect the photodetector itself which can sustain only a limited photocurrent prior to permanent damage.

In many applications, like LIDAR, fluorescence, and particle sizing, a powerful laser is used in conjunction with one or more photodetectors. In these applications, errant back reflections of the laser light into the photodetector is frequently a problem that can saturate the photodetector causing permanent damage. It has been demonstrated in the laboratory that the threshold for permanent damage in a commercial active quench avalanche photodiode is around 1 million photons within one nanosecond causing a photodiode current in excess of twenty miliamps. Lasers used in conjunction with many photodetector applications generate light levels many orders of magnitude above this permanent damage threshold. Thus, the need to quickly stop the photodiode current surge induced by errant light laser is mandatory in low light level detection applications such as single photon detection to avoid destruction of the photodiode.

One prior art way to limit the photodiode current is to use a high ohm (e.g., a kilo-ohm or higher) resistor in series with the photodetector. This approach has several limitations. Due to Ohm's law, the current in this high ohm resistor creates a voltage drop across the resistor even in the normal operating mode of the photodiode which reduces the bias voltage across the photodiode. This voltage drop decreases the photodetection efficiency of the photodiode since the light detection efficiency of the photodetector is directly related to the bias voltage across the detector. On the other hand, the use of a smaller resistor would not adequately protect the photodiode.

Also known in the art is a clipper circuit used to protect the front end sensing electronics against high photodetector currents caused by errant light sources. The clipper circuit, however, does not limit the photodetector current and thus does not protect the photodetector against high photodetector currents.

SUMMARY OF THE INVENTION

It is therefore an object of this invention to provide a current limiting watchdog circuit for photodetectors including photodiodes, avalanche photodiodes, and photomultiplier tubes.

It is a further object of this invention to provide a watchdog current limiting circuit which can withstand high errant light levels without degradation of the photodetector or the front end sensing circuitry.

It is a further object of this invention to provide a watchdog current limiting circuit which limits the current flowing in the photodetector to avoid its destruction.

It is a further object of this invention to provide a watchdog current limiting circuit which does not affect the detection efficiency of the photodetector in its normal operating region.

It is a further object of this invention to provide a watchdog current limiting circuit which does not affect the input impedance of the front end sensing electronics attached to the output of the photodetector.

It is a further object of this invention to provide a watchdog current limiting circuit which operates independently of the supply voltage level applied to the photodetector.

This invention results from the realization that by connecting the source of a transistor to a sensing resistor which monitors the photodetector current and connecting the drain of the transistor to the photodetector, then the drain/current resistance of the transistor can be increased to the transistor's saturation point to protect the photodetector from high currents caused by errant light sources but only when the photodetector current reaches a trigger point to thus maintain the detection efficiency of the photodetector below the trigger point where the drain/source resistance of the transistor is very low. In the preferred embodiment, the gate of the transistor is connected to a bias voltage so that the transistor gate/source voltage decreases to drive the transistor drain/source resistance up as the photodetector current increases. Also in the preferred embodiment, the bias voltage is independent of the polarization voltage applied to the photodetector.

This invention features a large current watchdog circuit for a photodetector. The watchdog circuit comprises a current sensing device responsive to current flowing through the photodetector; and a variable impedance element responsive to the current sensing device and the photodetector which increases in resistance in response to current flowing through the photodetector to protect the photodetector from high current levels.

In one example, the photodetector is a photodiode. One current sensing device is a resistor connected between the voltage supply source and the photodetector. In the same example, the variable impedance element is a transistor having its drain connected to the photodetector and its source connected to the resistor thus providing a drain/source resistance which varies in response to the current flowing through the photodetector. The gate of the transistor is connected to a bias voltage source. The bias voltage source may include a capacitor for holding the voltage at the gate of the transistor steady and a resistor in parallel with the capacitor. In the preferred embodiment, the bias voltage source draws voltage from the supply voltage source and includes a plurality of diodes interconnected between the supply voltage source and the gate of the transistor.

In another embodiment, the bias voltage source includes a Zener diode interconnected between the supply voltage source and the gate of the transistor. In still another example, the bias voltage source is a battery.

In the preferred embodiment, the watchdog circuit comprises a photodetector connected to a supply voltage source; a sensing resistor connected between the supply voltage source and the photodetector; a bias voltage source; and a transistor having its source connected to the sensing resistor, its drain connected to the photodetector, and its gate connected to the bias voltage source such that the drain/source resistance increases when the gate/source voltage decreases to thereby protect the photodetector from large currents.

In the broader sense, there is a photodetector connected to a voltage supply source; a variable impedance connected between the supply voltage source and the photodetector; and a variable voltage responsive to the photodetector current to drive the variable impedance up as the photodetector current increase. In the typical case, the variable impedance is the source and drain of a transistor connected between the voltage supply source and the photodetector. A resistor is then connected between the source of the transistor and the voltage supply source and the variable voltage is the gate and source of the transistor, the gate connected to a bias voltage source, the source connected between the photodetector and the resistor.

Also in the preferred embodiment, the watchdog circuit includes a photodetector connected to a voltage supply source; a bias voltage source; and a transistor having its source and drain interconnected between the photodetector and the voltage supply source and its gate connected to a bias source operating to keep the transistor on, the transistor having a low value source/drain resistance (e.g., 850 ohms) when the photodetector current is at nominal levels (e.g., 20 miliamps), so that the operation of the photodetector is not affected. The transistor becomes saturated, however, when the photodetector current exceeds the nominal levels, and then has a high source/drain resistance value (e.g., infinity) to protect the photodetector from high level current values. In one specific example, the transistor impedes photocurrent values above about 20 miliamps but has only an 85 ohm source/drain resistance when the photodocument is below 20 miliamps such that even avalanche photodiodes operated in the Geiger mode are not adversely affected by the watchdogs circuit when the photocurrent is below this nominal level.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
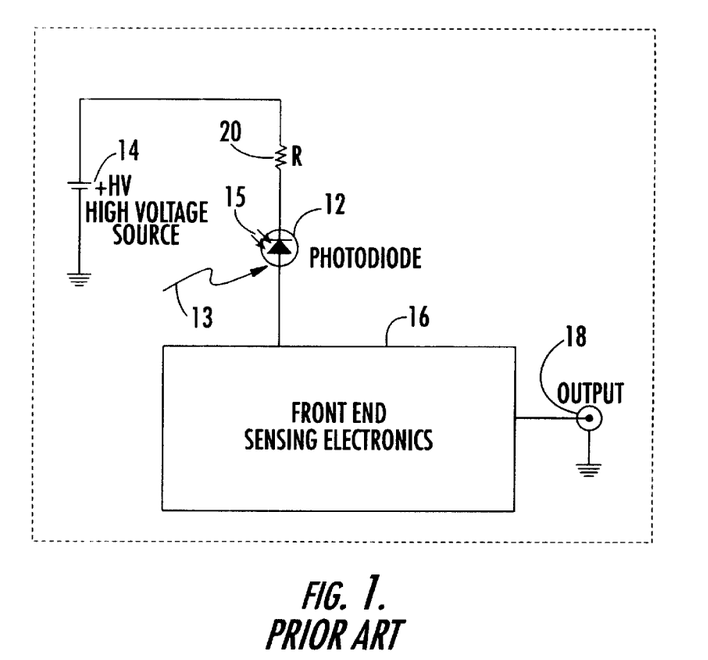
FIG. 1 is a schematic view of a prior art watchdog circuit for a photodetector employing a high ohm resistor.

As discussed in the background section above, a typical photodetector such as photodiode 12, FIG. 1 is connected to voltage supply source 14 and, when light 15 strikes photodetector 12, it outputs a photodiode current (photocurrent) proportional to the intensity of light 15 incident thereon. This photodiode current is then amplified and converted to a voltage or other signal by front end electronics 16 and provided to output 18. The resulting output signal is indicative of the incident light level or, in the case of avalanche photodiodes, the presence of a single photon striking photodiode 12.

When, however, the incident light level is too high, such as from a laser which scatters errant light in the direction of photodiode 12 as shown at 13, the resultant in photodiode current can destroy photodiode 12 and also adversely affect front end sensing electronics 16.

In the prior art, high ohm resistor 20 (typically thousands of ohms) impedes any high photodiode current levels caused by errant light 13. Unfortunately, high ohm resistor 20 also causes a bias voltage drop across photodiode 12 reducing its sensitivity and efficiency.

Figure 2:
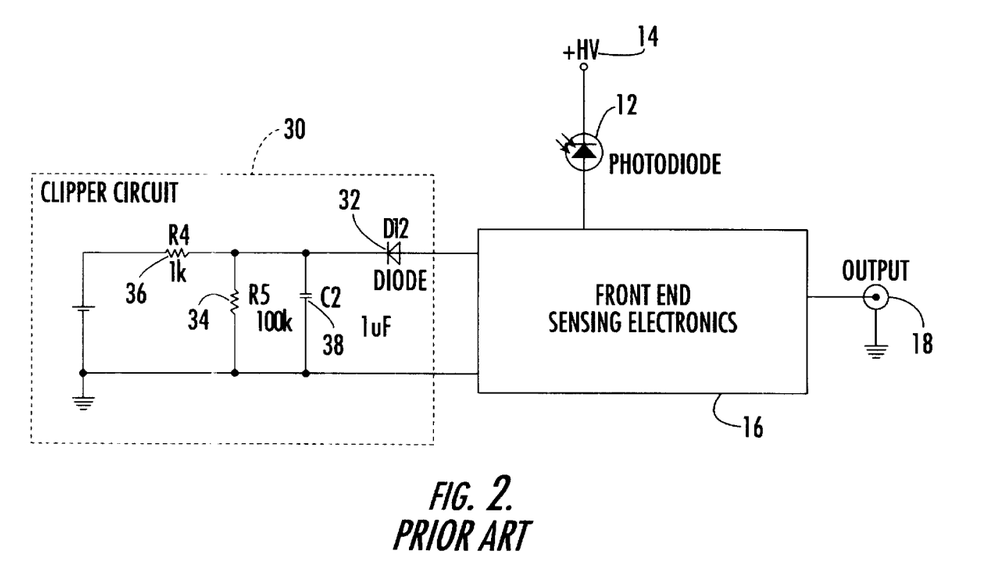
FIG. 2 is a circuit diagram of a prior art clipper circuit used to protect the front end sensing electronics coupled to a photodetector against high photodetector current levels.

It is also known in the art to include clipper circuit 30, FIG. 2 including diode 32, resistors 34 and 36 and capacitor 38 to protect front end sensing electronics 16 from high photodiode current levels. As delineated in the background section above, however, clipper circuit 30 does not protect photodiode 12 from damage caused by high photodiode current levels resulting from errant light incident thereon.

Figure 3:
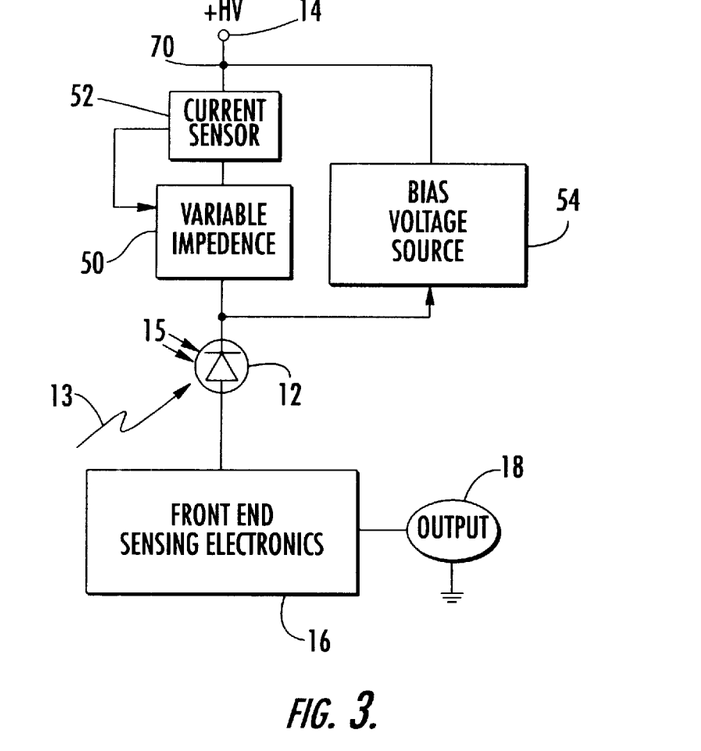
FIG. 3 is a schematic block diagram depicting the primary components associated with the watchdog circuit of the subject invention.

In this invention, a photodetector such as photodiode 12, FIG. 3 is protected against high photodiode current levels by the inclusion of variable impedance 50 between photodiode 12 and current sensor 52. Variable impedance 50 is low, e.g. 85 ohms, during the normal operation of photodetector 12. When, however, current sensor 52 senses a photodiode current in excess of a predetermined threshold (e.g., 20 miliamps), due to errant light 13, the impedance of variable impedance 50 is driven up to protect photodiode 12. In the preferred embodiment, the high impedance value for variable impedance 50 can be thought of as infinite impedance. After the errant light shown at 13 is removed, however, the impedance of variable impedance 50 returns to its low impedance value and photodiode 12 then operates in a normal manner. Thus, only when the photodetector current level reaches a trigger point does variable impedance 50 provide a large resistance. Bias voltage source 54 sets the trigger point and defines the maximum photocurrent limit. At all other times, for example, before the trigger point is reached and after the photodetector current falls below the trigger point, the resistance of variable impedance 50 is low to thus maintain the detection efficiency of the photodetector. This result is not possible in the prior art circuit shown in FIG. 1 since resistor 20 is fixed at a high resistance value.

Figure 4:
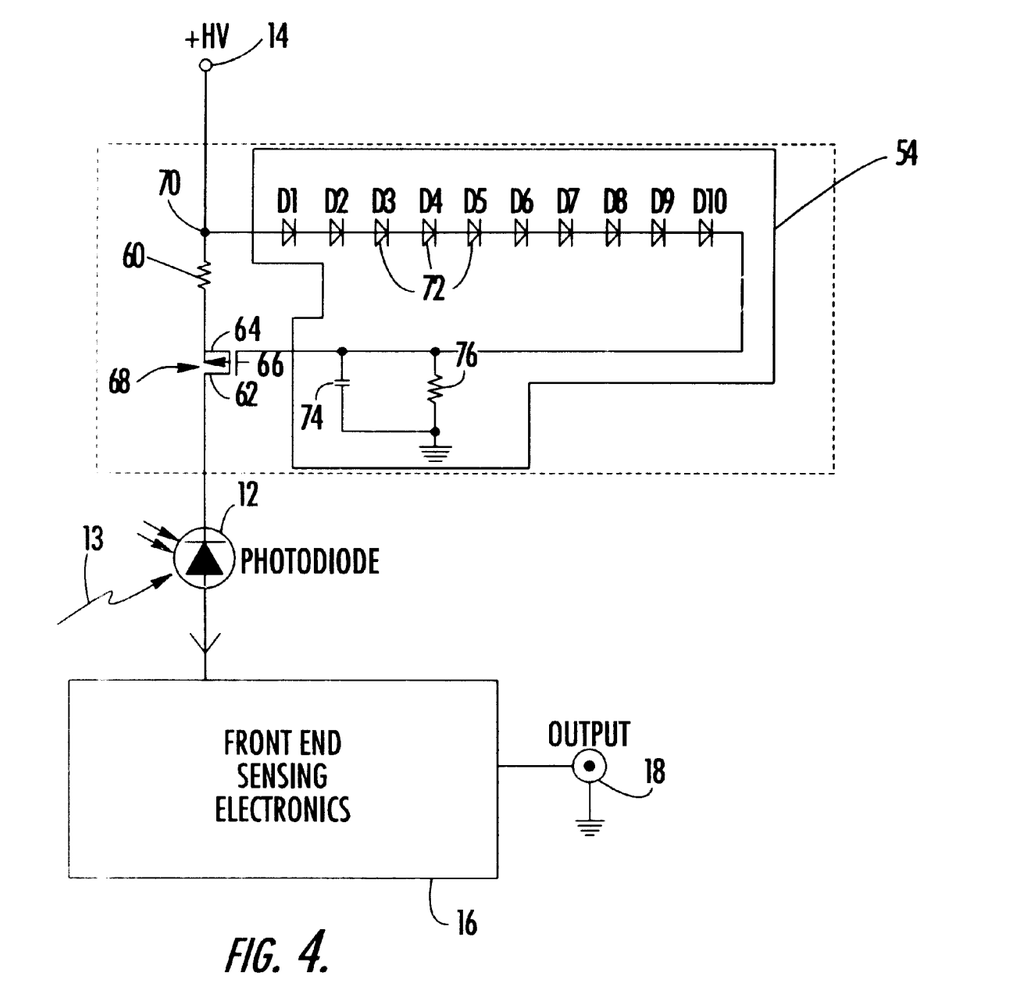
FIG. 4 is a circuit diagram showing one embodiment of the large current watchdog circuit for a photodetector in accordance with the subject invention.

In the preferred embodiment, variable impedance element 50, FIG. 3 is the resistance between source 64, FIG. 4 and drain 62 of Field Effect Transistor 68 which varies in proportion to the gate 66/source 64 voltage. Current sensor 52, FIG. 3 in this embodiment, is low ohm resistor 60, FIG. 4 (e.g., 100 ohms) connected between voltage supply source 14 and photodiode 12. Bias voltage source 54, FIG. 3, connected to gate 66, FIG. 4 of transistor 68, in this particular example, includes the combination of tap 70 to voltage supply source 14, a string of diodes 72, and capacitor 74 in parallel with resistor 76.

Thus, the present invention features a small series resistance when photodiode 12 is operating in its safe region but the resistance quickly switches to a high resistance value when the current flowing through photodiode 12 reaches a predefined trigger point. By carefully setting this trigger point below the damage current threshold of the photodetector used and/or the damage current threshold of front end sensing electronics 16, neither the detector nor the sensing electronics is adversely affected when a high intensity current is generated by errant light levels as shown at 13. In other words, the quick transition from a low to high impedance protects the photodetector against intense light levels but without degrading the performance of the photodetector in normal light level operating conditions. The photodetector trigger point of the watchdog circuit can be uniquely set by the bias voltage source 54 and the resistor 60 combination for any particular detector. Referencing the bias voltage source 54 to voltage supply 14 via the node 70 provides the independence of this invention to any operating voltage of the photodetector 12. Thus the invention exhibits the flexibility required to match the requirements of all the various operating conditions of different types of photodetector devices: photodiodes, avalanche photodiodes, and photomultiplier tubes.

In FIG. 4, the current sensing element in the form of resistor 60 monitors the current flowing in photodetector 12. A variable impedance element in the form of transistor 68 is controlled by the sensing element to limit the current in the photodiode. A biasing element in the form of capacitor 74 (e.g., 10 nF) maintains a constant offset voltage in reference to the photodiode bias voltage on the control input of the sensing element.

In the preferred embodiment, bias voltage source 54 biases the watchdog circuit and the photodetector. Low value resistor 60 in series with the photodetector acts as a sensing element of the current that flows through the photodetector. Variable impedance element 68 in series with the photodetector and the sensing element is, in this example, a Field Effect Transistor and the gate/source voltage of this Field Effect Transistor is used as the input that controls the impedance value. The constant offset, in reference to the photodetector bias voltage, is created by the voltage drop across the series of multiple diodes 72. Resistor 76 (e.g., 1 mΩ) is used to ensure a direct current path for the diodes. Decoupling capacitor 74 to the common voltage reference node (e.g., ground) maintains the offset constant.

Figure 5:
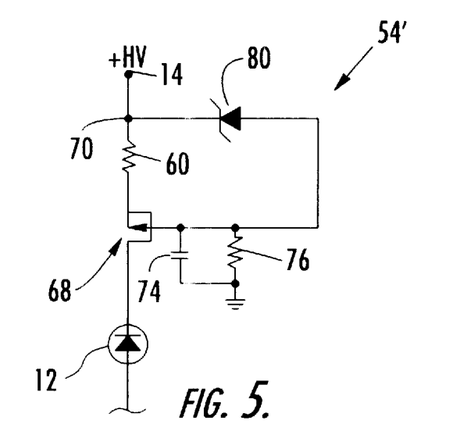
FIG. 5 is a circuit diagram showing an alternative embodiment of the bias voltage source shown in the circuit of FIG. 4.
Figure 6:
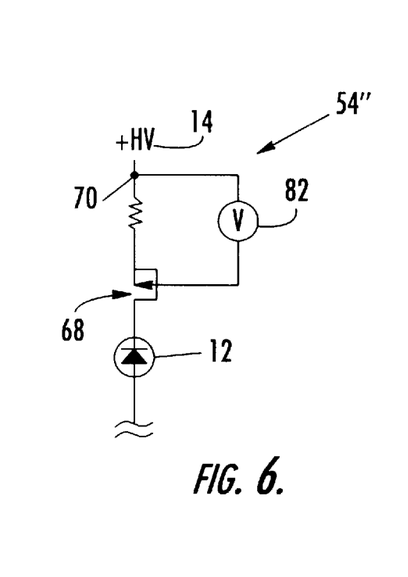
FIG. 6 is a circuit diagram showing another embodiment of the bias voltage source shown in the circuit of FIG. 4.

This invention, however, is not limited to the particular bias voltage source shown in FIG. 4. Other examples include bias voltage source 54', FIG. 5 and bias voltage source 54", FIG. 6. Bias voltage source 54', FIG. 5 includes Zener diode 80 which, it should be noted, draws more current from node 70 then the string of diodes shown in FIG. 4. Bias voltage source 54", FIG. 6, includes constant bias voltage source 82 such as a battery.

Figure 7:
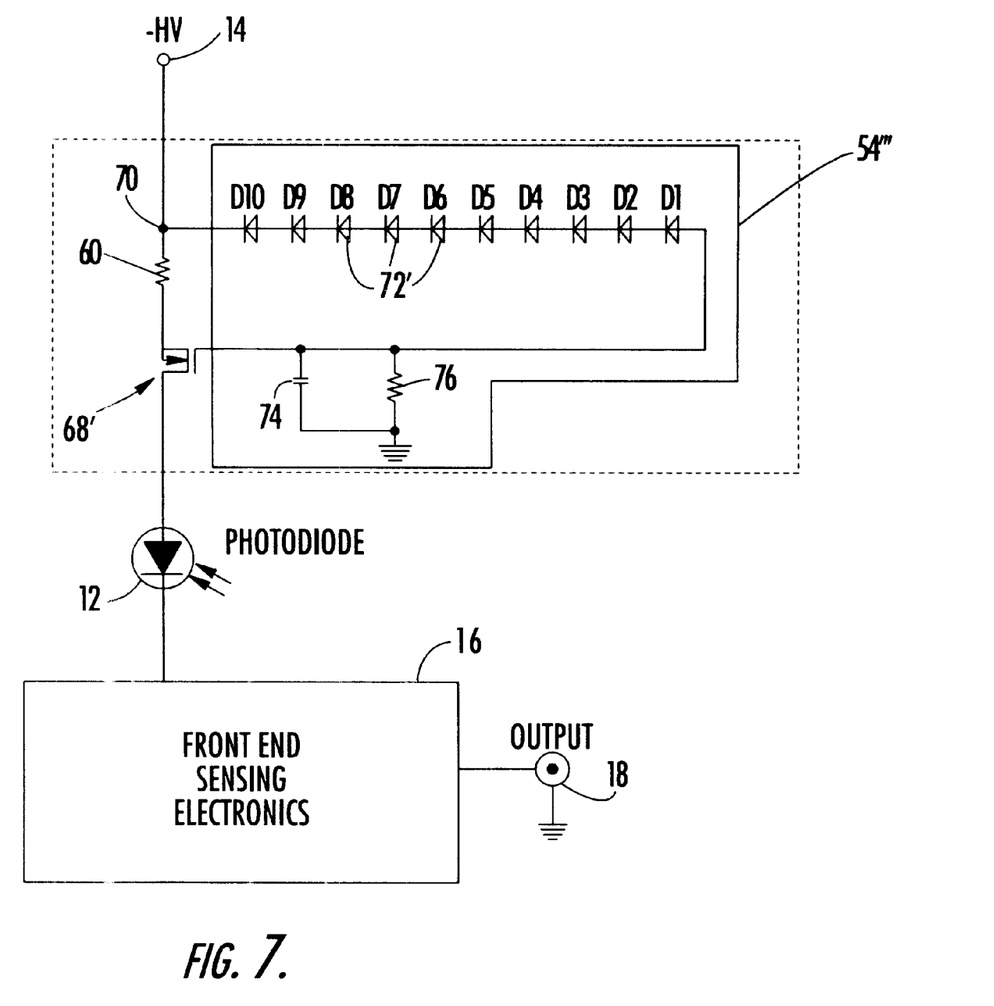
FIG. 7 is a circuit diagram depicting another embodiment of the large current watchdog circuit for a photodetector in accordance with the subject invention.

Also, in FIG. 4, transistor 68 is a P-type Field Effect Transistor (Part No. VP0550). In FIG. 7, however, transistor 68' is an N-type transistor (Part No. VN0550) and diodes 72' of bias voltage source 54'" are polarized opposite of diodes 72, FIG. 4 as shown.

The preferred embodiment shown in FIG. 4 limits the current through avalanche photodiode 12 to about 20 miliamps. Initially, as the photodiode is not detecting any light, there is barely any current flowing through drain 62 of Field Effect Transistor 68. In a typical photon counting application with a Geiger circuit, the light will trigger a photocurrent pulse from 2 miliamps to 10 miliamps according to laboratory measurements. As delineated above, the watchdog circuit is constructed such as to not interfere with the normal operation of photodiode 12 in this range of photocurrents. The photodetector bias is provided via voltage supply source 14. The current that flows through diode string 72 creates a voltage drop below the voltage level of supply voltage source 14 and the voltage drop across the string of diodes 72 is thus independent of supply voltage 14. If resistor 76 is correctly chosen to maintain a constant bias across the gate/source of transistor 68, the resistance introduced between the voltage supply source 14 and photodetector 12 is the sum of resistor 60 and the On-resistance of Field Effect Transistor 68. The transistor On-resistance is about 85 ohms, providing a total resistance value of 185 ohms in the normal photodiode current operating range—a resistance value which does not degrade the performance of photodiode 12 even in the Geiger mode.

Photodiode 12, however, may receive an abnormally high amount of light, such as when laser light strikes photodiode 12 as shown at 13, for example, or when the photodiode itself exhibits a specific misbehavior like becoming a short as in the situation of a second breakdown. In both examples, the photodiode current starts to increase rapidly flowing through transistor 68 and resistor 60. This increase of photocurrent creates a voltage drop in resistor 60 reducing the gate/source voltage of transistor 68. The gate/source voltage controls the drain/source resistance and, when the gate/source voltage decreases, then the drain/source resistance of transistor 68 increases limiting the current flow through it. This high (saturation) resistivity of transistor 68 also limits the amount of the charges that flow through photodetector 12.

The function of capacitor 74 is to hold the voltage at the gate of transistor 68 steady while it is transitioning from the On-state to the saturated state. In the absence of capacitor 74, the voltage at gate 66 of transistor 68 would tend to drop as well due to the internal gate/drain capacitance of the transistor thus preventing the reduction of the gate/source voltage.

Figure 8:
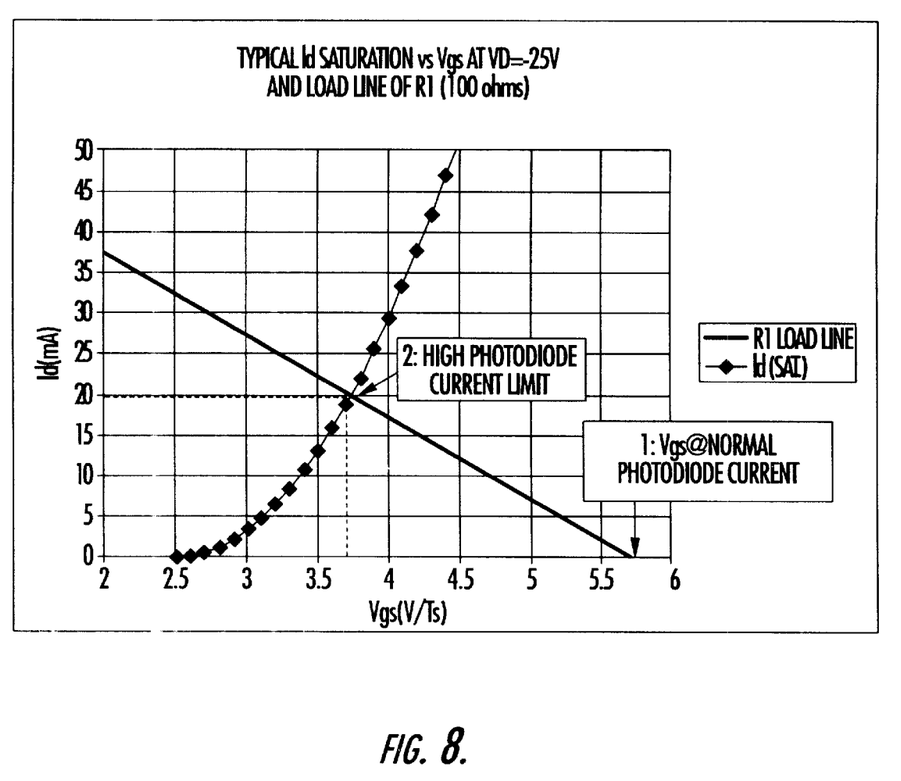
FIG. 8 is a graph showing a typical photodetector current saturation level versus the voltage between the gate and the source of the transistor used in the preferred embodiment of the subject invention and also the typical photodetector current saturation versus the load line of the sensing resistor in accordance with the preferred embodiment of the subject invention.

FIG. 8 shows the drain current (Id) versus gate/source voltage ($V_{gs}$) of transistor 68, FIG. 4 represented by the load line RI of resistor 60 and the saturation drain current of transistor 68 versus its gate/source voltage ($V_{gs}$) At low light levels, photodetector 12 is in its normal operating mode and the photocurrent (equal to Id) is small. In this operating condition, the $V_{gs}$ voltage drop across the watchdog circuit follows the R1 load line in FIG. 8. When abnormal photodiode current starts flowing through drain 62 of transistor 68, $V_{gs}$ starts decreasing as shown in FIG. 8 due to R1. The photocurrent (equal to Id) could continue to build-up until Id becomes equal to Id saturation (e.g., miliamps) which is the maximum allowed current that could flow through the photodetector for a particular $V_{gs}$ value. When this equilibrium point is reached, then Id can no longer increase.

Thus, the invention limits the photocurrent in a photodetector to avoid permanent damage to the photodetector and also to protect a front end sensing electronics from being destroyed by excessive current. In some embodiments, depending on the nature of the front end sensing electronics, a prior art clipper circuit (FIG. 2) can also be employed in addition to the watchdog circuit of this invention to prevent voltage spikes that occur at the input of the front end sensing electronics.

In the preferred embodiment, the invention consists of the three sub-circuits shown in FIG. 4. The first sub-circuit is transistor 68 which is used as a dynamic resistor—the controlled variable impedance circuit of the invention. The second sub-circuit is transistor 68. The second sub-circuit is the biasing voltage source used to provide a bias voltage to transistor 68 preferably independent of the polarization voltage 14 of photodiode 12. This is important in a production environment where many values of the polarization voltage must be used due to widespread characteristics of photodiodes. The biasing sub-circuit, in the preferred embodiment, consists of the string of BAS32 diodes 72, resistor 76, and capacitor 74. In this preferred embodiment, this sub-circuit provides a $V_{gs}$ of about 5.7 volts. This voltage is preferably greater than the pinch off voltage of transistor 68. The third sub-circuit consists of resistor 60: the sensing element of the invention. Those skilled in the art will choose a value of resistor 60 by taking into account the characteristics of both transistor 68 and the normal operating range of photodiode 12. In other embodiments, the specific circuit parameters discussed herein will vary depending on the specific circuit elements chosen for a particular application.

Thus, although specific features of the invention are shown in some drawings and not in others, this is for convenience only as each feature may be combined with any or all of the other features in accordance with the invention. Moreover, the words "including", "comprising", "having", and "with" as used herein are to be interpreted broadly and comprehensively and are not limited to any physical interconnection. In addition, any embodiments disclosed herein are not to be taken as the only possible embodiments: other embodiments will occur to those skilled in the art and are within the following claims.

What is claimed is:

1. A large current watchdog circuit for a photodetector, the circuit comprising:
    a current sensing device responsive to current flowing through the photodetector; and
    a variable impedance element responsive to the current sensing device and the photodetector which increases in resistance in response to current flowing through the photodetector to protect the photodetector from high current levels.

2. The circuit of claim 1 in which the photodetector is a photodiode.

3. The circuit of claim 1 in which the current sensing device is a resistor connected between a voltage supply source and the photodetector.

4. The circuit of claim 1 in which the variable impedance element is a transistor having its drain connected to the photodetector and its source connected to the current sensing element thus providing a drain/source resistance which varies in response to the current flowing through the photodetector.

5. The circuit of claim 4 in which the transistor has its gate connected to a bias voltage source.

6. The circuit of claim 5 in which the bias voltage source includes a capacitor for holding the voltage at the gate of the transistor steady.

7. The circuit of claim 6 in which the bias voltage source further includes a resistor in parallel with the capacitor.

8. The circuit of claim 5 in which the bias voltage source draws voltage from a voltage supply source.

9. The circuit of claim 8 in which the bias voltage source includes a plurality of diodes interconnected between the voltage supply source and the gate of the transistor.

10. The circuit of claim 8 in which the bias voltage source includes a zener diode interconnected between the voltage supply source and the gate of the transistor.

11. The circuit of claim 5 in which the bias voltage source is a battery.

12. A large current watchdog circuit for a photodetector, the circuit comprising:
    a photodetector connected to a voltage supply source;
    a sensing resistor connected between the voltage supply source and the photodetector;
    a bias voltage source; and
    a transistor having its source connected to the sensing resistor, its drain connected to the photodetector, and its gate connected to the bias voltage source such that the drain/source resistance increases when the gate/source voltage decreases to thereby protect the photodetector from large currents.

13. The circuit of claim 12 in which the photodetector is a photodiode.

14. The circuit of claim 12 in which the bias voltage source is connected to the voltage supply source and draws voltage therefrom.

15. The circuit of claim 14 in which the bias voltage source includes a series of diodes connected between the voltage supply source and the gate of the transistor.

16. The circuit of claim 15 in which the bias voltage source further includes a capacitor disposed between the gate of the transistor and the series of diodes and connected to ground.

17. The circuit of claim 12 in which the bias voltage source includes a zener diode interconnected between the voltage supply source and the gate of the transistor.

18. The circuit of claim 12 in which the bias voltage source is a battery.

19. A watchdog circuit for a photodetector, the circuit comprising:
- a photodetector connected to a voltage supply source;
- a variable impedance connected between the voltage supply source and the photodetector; and
- a variable voltage responsive to the photodetector current to drive the variable impedance up as the photodetector current increase.

20. The circuit of claim 19 in which the photodetector is a photodiode.

21. The circuit of claim 19 in which the variable impedance is the source and drain of a transistor connected between the voltage supply source and the photodetector.

22. The circuit of claim 21 further including a resistor between the source of the transistor and the voltage supply source.

23. The circuit of claim 19 in which the variable voltage is the gate and source of a transistor, the gate connected to a bias voltage source, the source connected between the photodetector and the voltage supply source.

24. A watchdog circuit for a photodetector, the circuit comprising:
- a photodetector connected to a voltage supply source;
- a bias voltage source; and
- a transistor having its source and drain interconnected between the photodetector and the voltage supply source and its gate connected to the bias voltage source operating to keep the transistor on, the transistor having a low value source/drain resistance when the photodetector current is at nominal levels, so that the operation of the photodetector is not affected, the transistor becoming saturated when the photodetector current exceeds the nominal levels and then having a high source/drain resistance value to protect the photodetector from current values above the nominal levels.

\* \* \* \* \*